United States Patent
Alter

(10) Patent No.: US 7,573,098 B2
(45) Date of Patent: Aug. 11, 2009

(54) TRANSISTORS FABRICATED USING A REDUCED COST CMOS PROCESS

(75) Inventor: Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/833,138

(22) Filed: Aug. 2, 2007

(65) Prior Publication Data

US 2009/0032850 A1    Feb. 5, 2009

(51) Int. Cl.
*H01L 29/78* (2006.01)
(52) U.S. Cl. ............... 257/335; 438/306; 257/E29.256
(58) Field of Classification Search ............... 257/336, 257/344, E29.256, 335; 438/306
See application file for complete search history.

(56) References Cited

U.S. PATENT DOCUMENTS

| | | | |
|---|---|---|---|
| 5,315,144 A * | 5/1994 | Cherne | 257/351 |
| 5,650,340 A | 7/1997 | Burr et al. | |
| 5,677,224 A | 10/1997 | Kadosh et al. | |
| 5,789,787 A | 8/1998 | Kadosh et al. | |
| 5,923,982 A | 7/1999 | Kadosh et al. | |
| 6,051,471 A | 4/2000 | Gardner et al. | |
| 6,078,080 A | 6/2000 | Kadosh et al. | |
| 6,200,684 B1 | 3/2001 | Yamaguchi et al. | |
| 2005/0205926 A1 * | 9/2005 | Chen et al. | 257/335 |

OTHER PUBLICATIONS

Stanley Wolf Ph.D., "Silicon Processing for the VLSI Era vol. 2: Process Integration," Copyright © 1990 by Lattice Press, pp. 381-389.

* cited by examiner

*Primary Examiner*—Douglas M Menz
*Assistant Examiner*—Steven J Fulk
(74) *Attorney, Agent, or Firm*—Patent Law Group LLP; Carmen C. Cook

(57) ABSTRACT

An NMOS transistor includes a semiconductor substrate of a first conductivity type, first and second well regions of a second conductivity type formed spaced apart in the substrate, a conductive gate formed over the region between the spaced apart first and second well regions where the region of the substrate between the spaced apart first and second well regions forms the channel region, dielectric spacers formed on the sidewalls of the conductive gate, first and second heavily doped source and drain regions of the second conductivity type formed in the semiconductor substrate and being self-aligned to the edges of the dielectric spacers. The first and second well regions extend from the respective heavily doped regions through an area under the spacers to the third well region. The first and second well regions bridge the source and drain regions to the channel region of the transistor formed by the third well.

9 Claims, 2 Drawing Sheets

TRANSISTORS FABRICATED USING A REDUCED COST CMOS PROCESS

FIELD OF THE INVENTION

The invention relates to an N-channel MOS transistor manufactured in a CMOS fabrication process and, in particular, to an N-channel MOS transistor manufactured in a CMOS fabrication process using N-Wells to replace the LDD regions under the spacer.

DESCRIPTION OF THE RELATED ART

CMOS fabrication processes that have transistor channel length less than 2 µm use lightly doped regions at the edge of the transistor gate to solve the problem of the hot electron injection. The lightly doped region is referred to as lightly doped drain (LDD) even though the LDD regions are formed at both the source and drain sides of the transistor gate. LDD structures can be applied to NMOS and/or PMOS transistors.

When LDD structures are used for both the NMOS and PMOS transistors, forming the LDD regions for both types of transistors adds two additional masking steps. FIG. 1 is a cross-sectional view of a conventional NMOS transistor for illustrating the process for forming LDD regions in the NMOS transistor and the resulting transistor structure. Referring to FIG. 1, the polysilicon gate (poly gate) 12 is deposited on top of the gate oxide layer and is patterned. Then, the LDD implant is applied using the poly gate 12 as a mask. The LDD implants are thus self-aligned to the poly gate 12. To selectively form the P-type LDD regions and N-type LDD regions, two masking steps are required. For example, a first masking step is carried out to cover areas associated with PMOS transistors and the N-type LDD implantation is carried out. For instance, to form the N-type LDD (NLDD) regions 14 in NMOS transistor 10, the first masking step covers the PMOS transistors so that N-type implants are introduced into areas of the NMOS transistors. Then, a second masking step is carried out to cover areas associated with the NMOS transistors and the P-type LDD implantation is carried out.

After the LDD implants, a conformal layer of dielectric material (such as silicon dioxide or silicon nitride) is deposited and anisotropic etching is carried out to remove the dielectric material everywhere except along the sidewalls of poly gate 12, thereby forming spacers 16 on both sides of poly gate 12. Using the spacers as the mask, the source/drain implants can now be applied to form heavily doped N+ or P+ regions. The heavily doped source/drain implants are self-aligned to the spacers 16 so that the heavily doped regions are formed outside of the LDD regions. To selectively form N+ regions for the NMOS transistors and P+ regions for PMOS transistors, two more masking steps as described above with reference to the LDD implants are carried out. For NMOS transistor 10, the N+ implant is applied to form heavily doped N+ regions 18 that are self-aligned to the outside edge of spacers 16. In general, annealing is performed to anneal the implanted areas to form the NLDD regions 14 and the N+ regions 18 as the source and drain regions of the NMOS transistor 10. Regions 19 are P-type or Boron field implant regions (BFLD) which are formed to improve the isolation of the NMOS transistors, as are well known in the art.

In some NMOS transistors, NLDD is only used at the source and not at the drain of the transistor. For instance, in LDMOS transistors, the LDD region is removed at the drain side. The NLDD region can also be effectively deactivated functionally if the drain side of the poly gate is formed on top of the field oxide layer. However, the LDD regions at the source are still used in this case to connect the source region under the spacer to the channel. Placing the heavily doped regions next to the gate oxide is undesirable due to hot electron injection.

SUMMARY OF THE INVENTION

According to one embodiment of the present invention, an NMOS transistor includes a semiconductor substrate of a first conductivity type, first and second well regions of a second conductivity type opposite the first conductivity type formed spaced apart in the semiconductor substrate, a conductive gate formed on the semiconductor substrate and electrically isolated from the semiconductor substrate by a dielectric layer where the conductive gate is formed over the region between the spaced apart first and second well regions and the region of the substrate between the spaced apart first and second well regions under the conductive gate forms the channel region of the transistor, first and second dielectric spacers formed on the sidewalls of the conductive gate, first and second heavily doped regions of the second conductivity type formed in the semiconductor substrate and being self-aligned to the edges of the dielectric spacers where the first and second heavily doped regions form source and drain regions. The first well region extends from the first heavily doped region through an area under the first spacer to the channel region, and the second well region extends from the second heavily doped region through an area under the second spacer to the channel region. The first and second well regions bridge the source and drain regions to the channel region of the transistor.

According to another aspect of the present invention, the NMOS transistor further includes a third well region of the first conductivity type formed between the first and second well regions and under the conductive gate where the third well forms the channel region.

The present invention is better understood upon consideration of the detailed description below and the accompanying drawings.

DETAILED DESCRIPTION OF THE PREFERRED EMBODIMENTS

In accordance with the principles of the present invention, an NMOS transistor uses N-wells to replace the N-type LDD regions so as to eliminate one masking step in the CMOS fabrication process and thereby reducing the cost of the fabrication process. In a 15 masking step fabrication process, saving one masking step results in roughly 5% cost saving.

The NMOS transistor of the present invention is advantageous in integrated circuits that include only a few NMOS and/or PMOS transistors with long channel length. For example, an LDO integrated circuit includes a big power transistor (typically P-channel) and a small number of NMOS/PMOS transistors. Alternately, a smart switch integrated circuit may include a p-channel power transistor with a few other NMOS/PMOS transistors.

In accordance with the present invention, the N-type LDD regions (NLDD) of the NMOS transistor is eliminated but the P-type LDD regions (PLDD) of the PMOS transistor remain. Because spacers are formed non-selectively, the spacers will be formed for both the NMOS and the PMOS transistors. Thus, when the NLDD regions are eliminated, it is necessary to provide another means to connect the heavily doped N+ source/drain regions to the channel region of the NMOS transistor in the absence of the LDD regions. According to the principles of the present invention, N-well regions are used to replace the NLDD regions so that a functional NMOS transistor is formed with spacers but without NLDD regions.

Figure 2:
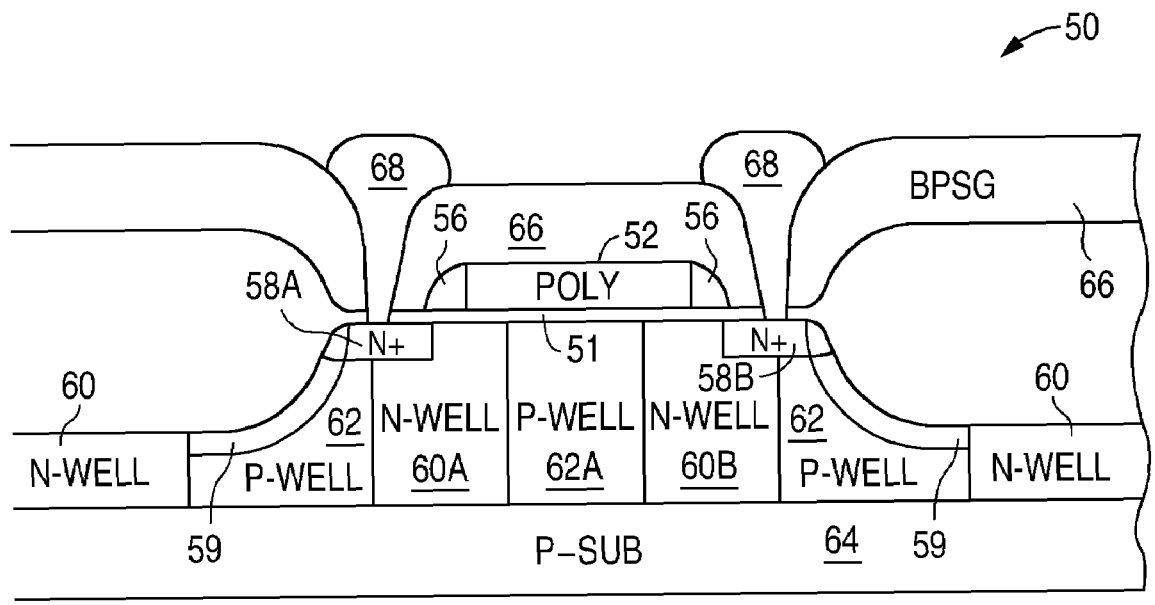
FIG. 2 is a cross-sectional view of an NMOS transistor according to one embodiment of the present invention.

FIG. 2 is a cross-sectional view of an NMOS transistor according to one embodiment of the present invention. Referring to FIG. 2, an NMOS transistor 50 is formed on a P-type substrate 64. First, N-wells and P-wells of NMOS transistor 50 are formed in substrate 64. In the present embodiment, N-wells and P-wells are formed using a self-aligned process. That is, a well masking step is carried out to define either the N or the P well areas receiving the respective well implantation. Areas not defined will be made into wells of the other type. In one embodiment, a well mask is used to define N-wells areas and all other areas on the substrate 64 that are not N-wells will be made into P-wells. Thus, N-wells and P-wells are self-aligned regions in P-substrate 64. In other embodiments, the N-wells and P-wells are defined using separate N-well and P-well masks.

Figure 1:
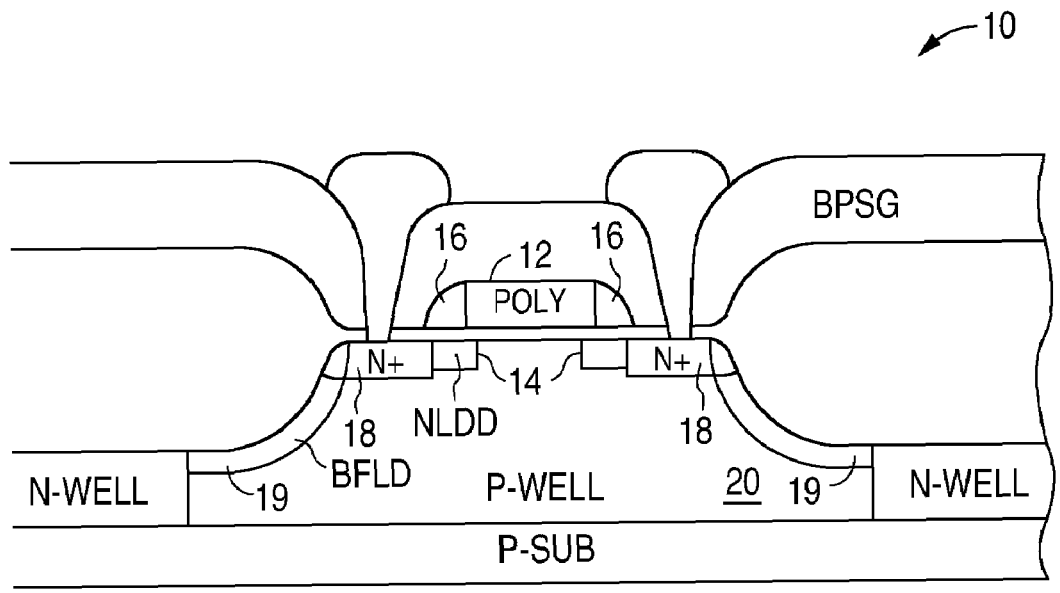
FIG. 1 is a cross-sectional view of a conventional NMOS transistor including N-type LDD (NLDD) regions adjacent to the polysilicon gate.

In conventional NMOS transistors, such as NMOS transistor 10 of FIG. 1, the entire NMOS transistor is formed in a single P-well, such as P-well 20. However, according to one embodiment of the present invention, NMOS transistor 50 is formed in alternating N-wells 60 and P-wells 62 so that selected N-well regions 60A and 60B functions to replace the NLDD regions which are eliminated from the NMOS transistor.

More specifically, the well mask for NMOS transistor 50 defines an N-well 60A to be situated under one sidewall spacer on one side of the poly gate to be formed. The well mask also defines another N-well 60B to be situated under the other sidewall space on the other side of the poly gate. In the present embodiment, areas not receiving the N-well implants will be made into P-wells. Thus, P-well 62 and 62A will be formed between N-wells 60, 60A and 60B. P-well 62A functions as the channel region of NMOS transistor 50.

After the well formation, the active areas where active devices, such as transistors, are to be formed are defined. Typically, a nitride mask is used to cover the active areas on P-substrate 64. Areas on P-substrate 64 not covered by the nitride mask are not active areas and will be exposed to the field oxidation process where a field oxide layer will be grown. In the present embodiment, prior to field oxidation, P-substrate 50 is subjected to a boron field implant process where boron field regions 59 are to be formed under the field oxide layer.

Next, a gate oxide layer 50 is formed and then the polysilicon layer is deposited and pattered to form poly gate 52. The NMOS transistor 50 may be masked off while the PMOS transistor formed on the same P-substrate 64 receives the PLDD implants. NMOS transistor 50 does not receive any NLDD implants and therefore one masking step is eliminated.

After the PLDD implant step, a conformal layer of dielectric material (such as silicon dioxide or silicon nitride) is deposited and anisotropic etching is carried out to remove the dielectric material everywhere except along the sidewalls of poly gate 52, thereby forming spacers 56 on both sides of poly gate 52. Using the spacers as the mask, the source/drain implants are now applied to form heavily doped N+ or P+ regions to form NMOS or PMOS transistors. To selectively form N+ regions for the NMOS transistors and P+ regions for PMOS transistors, two more masking steps are carried out where the NMOS transistor areas are covered while the P+ implantation is taking place and vice versa.

For NMOS transistor 50, the N+ implant is applied to form heavily doped N+ regions 58A and 58B that are self-aligned to the outside edge of spacers 56. In general, annealing is performed to anneal the implanted areas to form N+ regions 58A and 58B as the source and drain regions of the NMOS transistor 50. Subsequent to the source/drain formation, a dielectric layer 66, such as a BPSG layer, is formed over the surface of the substrate 64. Metal contacts 68 are formed in openings in the dielectric layer 66 to provide electrical connection to the source and drain of transistor 50.

As thus constructed, NMOS transistor 50 is formed with spacers 56 but without any NLDD regions. Instead, N-wells 60A and 60B extend from N+ regions 58A and 58B and under spacer 56 to bridge N+ regions 58A and 58B to the channel region of transistor 50 formed by P-well 62A. In this manner, the N-well region between the N+ region and the P-well functions as the NLDD region to provide a lightly doped N-type region at the edge of the poly gate 52 to avoid hot electron injection.

When alternate well regions are used to form the LDD and channel regions of NMOS transistor 50, the channel length of the transistor necessarily increases. In one embodiment, the channel length of NMOS transistor 50 is about 4.4 μm while the width of spacers 56 is about 0.3 μm. The size of NMOS transistor 50 is thus bigger than the minimally sized transistors. While NMOS transistor 50 may not be practical as a general-purpose transistor because of its large size, NMOS transistor 50 is advantageous in applications where there are only a few transistors and therefore increasing the sizes of the few transistors do not pose a problem. When NMOS transistor 50 is applied, the elimination of one masking step can result in appreciable saving in the fabrication cost.

Furthermore, NMOS transistor 50 realizes advantageous electrical characteristics. First, NMOS transistor 50 has a higher breakdown voltage (BVDSS) due to reduced electric field and deeper drain junction. Second, NMOS transistor 50 is a symmetrical high voltage device where both the source as well as the drain can achieve high voltages. The symmetrical structure is not achievable in other high voltage devices such as NCH LDMOS devices. Third, NMOS transistor 50 has improved analog characteristics such as higher output impedance due to less impact ionization and reduced electric field due to the lightly doped N-well compared to NLDD regions. Lastly, the NMOS transistor 50 can be applied in FLASH products to achieve the higher voltages needed for FLASH devices.

According to another aspect of the present invention, NMOS transistor 50 can be formed without P-well 62A in the channel region of the transistor. In that case, the substrate, without or without additional threshold adjustment implants, serves as the channel of the transistor. When the channel of the NMOS transistor is formed in the P-substrate 64, either a substrate device (with threshold adjust enhancement implantation) or a native device (without any threshold adjust implantation) results. The threshold voltage of the NMOS transistor thus formed is lower than when P-well 62A is used. For example, the threshold voltage for NMOS transistor 50 including a channel region formed in P-well 62A may be around 0.7V. The threshold voltage for a similar NMOS transistor but without P-well 62A may be as low as 0V for a native device or around 0.5V in the case when blanket threshold implant has been applied to the substrate. In some applications, the lower threshold voltages for the NMOS transistor are of advantages.

According to another aspect of the present invention, the NMOS transistor can be fabricated in an NMOS only fabrication process. In that case, the same transistor structure of NMOS transistor 50 in FIG. 2 can be formed using the NMOS fabrication process but P-well regions (62, 62A) are not needed.

Figure 3:
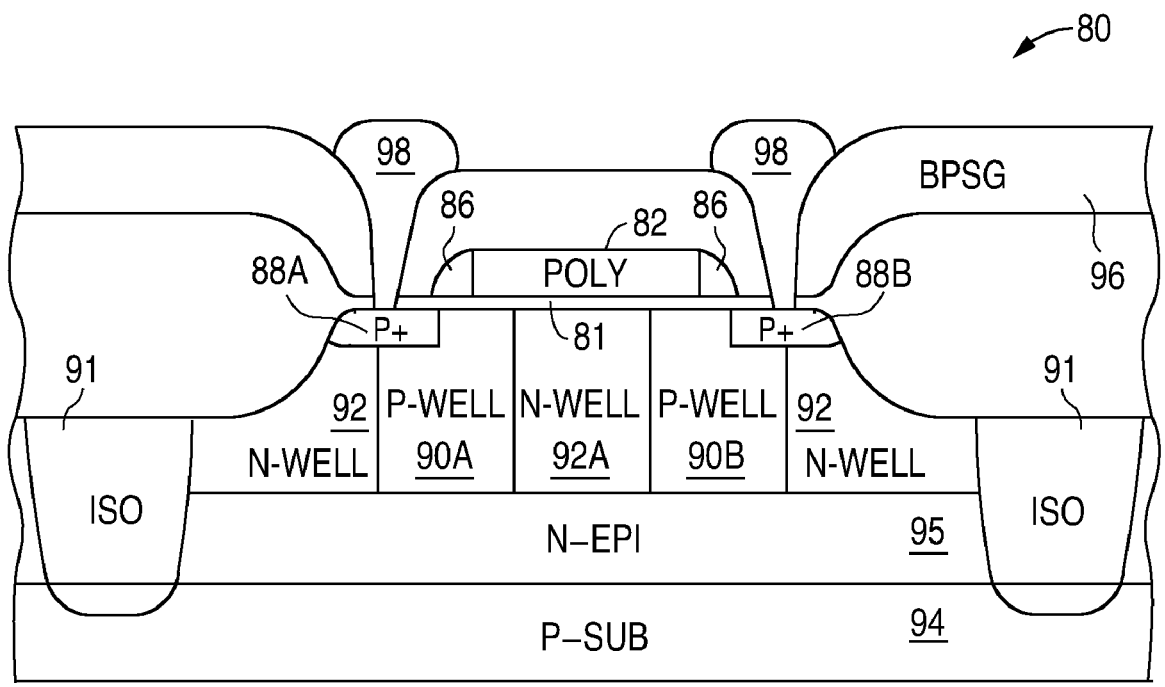
FIG. 3 is a cross-sectional view of a PMOS transistor according to one embodiment of the present invention.

In the above described embodiments, the LDD regions are removed from the NMOS transistors only. In other embodiments, it is also possible to eliminate the PLDD regions from PMOS transistors and use P-wells to bridge the heavily doped P+ source/drain regions to the channel of the PMOS transistor. FIG. 3 is a cross-sectional view of a PMOS transistor according to one embodiment of the present invention. Referring to FIG. 3, PMOS transistor 80 is typically formed in a BiCMOS process where an N-type epitaxial (N-Epi) layer 95 is formed on a P-type substrate 94. P++ isolation region 91 is formed surrounding PMOS transistor 80 for isolation. In PMOS transistor 80, spacers 86 are formed along the sidewalls of polysilicon gate 82 but no P-type LDD implants are applied under the spacers. Instead, during the well formation process, P-wells 90A and 90B are formed and positioned under and around spacers 86. When the P+ source and drain regions 88A and 88B are formed, P-wells 90A and 90B bridge the respective source/drain regions to the channel formed by N-well 92A. In an alternate embodiment, N-well 92A is eliminated and the channel region is formed in the N-Epi 95 itself.

As thus constructed, PMOS transistor 80 is formed with spacers 86 but without any PLDD regions. Instead, P-wells 90A and 90B extend from P+ regions 88A and 88B and under spacer 86 to bridge P+ regions 88A and 88B to the channel region of transistor 80, formed by N-well 92A or formed by the N-Epi layer 95.

The above detailed descriptions are provided to illustrate specific embodiments of the present invention and are not intended to be limiting. Numerous modifications and variations within the scope of the present invention are possible. For example, the P-type substrate in which the NMOS transistor is formed can have other structures, such as an epitaxial layer on top of the substrate. The present invention is defined by the appended claims.

I claim:

1. An NMOS transistor comprising:
  a semiconductor substrate of a P-type conductivity;
  first and second well regions of an N-type conductivity formed spaced apart in the semiconductor substrate;
  a conductive gate formed on the semiconductor substrate and electrically isolated from the semiconductor substrate by a dielectric layer, the conductive gate being formed over the region between the spaced apart first and second well regions, the region of the substrate between the spaced apart first and second well regions under the conductive gate forming the channel region of the transistor;
  first and second dielectric spacers formed on the sidewalls of the conductive gate;
  first and second heavily doped regions of the N-type conductivity formed in the semiconductor substrate and being self-aligned to the edges of the dielectric spacers, the first and second heavily doped regions forming source and drain regions,
  wherein the first well region extends from partway in the first heavily doped region through an area under the first spacer to the channel region, and the second well region extends from partway in the second heavily doped region through an area under the second spacer to the channel region, the first and second well regions bridging the source and drain regions to the channel region of the transistor without any lightly doped regions.

2. The NMOS transistor of claim 1, further comprising:
  a third well region of the P-type conductivity formed between the first and second well regions and under the conductive gate, the third well forming the channel region.

3. The NMOS transistor of claim 2, wherein the third well forming the channel region has a length of at least 4 μm and the channel length of the NMOS transistor is at least 4 μm.

4. The NMOS transistor of claim 1, wherein the first well region extends partially into the first heavily doped region and the second well region extends partially into the second heavily doped region.

5. The NMOS transistor of claim 1, wherein the first and second dielectric spacers comprise spacers formed using a material selected from silicon nitride or silicon oxide.

6. A PMOS transistor comprising:
  a semiconductor substrate of an N-type conductivity;
  first and second well regions of a P-type conductivity formed spaced apart in the semiconductor substrate;
  a conductive gate formed on the semiconductor substrate and electrically isolated from the semiconductor substrate by a dielectric layer, the conductive gate being formed over the region between the spaced apart first and second well regions, the region of the substrate between the spaced apart first and second well regions under the conductive gate forming the channel region of the transistor;
  first and second dielectric spacers formed on the sidewalls of the conductive gate;
  first and second heavily doped regions of the P-type conductivity formed in the semiconductor substrate and being self-aligned to the edges of the dielectric spacers, the first and second heavily doped regions forming source and drain regions,
  wherein the first well region extends from partway in the first heavily doped region through an area under the first spacer to the channel region, and the second well region extends from partway in the second heavily doped region through an area under the second spacer to the channel region, the first and second well regions bridging the source and drain regions to the channel region of the transistor without any lightly doped regions.

7. The PMOS transistor of claim 6, further comprising:
  a third well region of the N-type conductivity formed between the first and second well regions and under the conductive gate, the third well forming the channel region.

8. The PMOS transistor of claim 6, wherein the first well region extends partially into the first heavily doped region and the second well region extends partially into the second heavily doped region.

9. The PMOS transistor of claim 6, wherein the first and second dielectric spacers comprise spacers formed using a material selected from silicon nitride or silicon oxide.

* * * * *

UNITED STATES PATENT AND TRADEMARK OFFICE
CERTIFICATE OF CORRECTION

| | | |
|---|---|---|
| PATENT NO. | : 7,573,098 B2 | Page 1 of 1 |
| APPLICATION NO. | : 11/833138 | |
| DATED | : August 11, 2009 | |
| INVENTOR(S) | : Martin Alter | |

It is certified that error appears in the above-identified patent and that said Letters Patent is hereby corrected as shown below:

On the Title of the patent:

At Item (54), please change the title "TRANSISTORS FABRICATED USING A REDUCED COST CMOS PROCESS" to read:

--"N-CHANNEL MOS TRANSISTOR FABRICATED USING A REDUCED COST CMOS PROCESS"--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,573,098 B2  Page 1 of 1
APPLICATION NO. : 11/833138
DATED : August 11, 2009
INVENTOR(S) : Martin Alter It is certified that error appears in the above-identified patent and that said Letters Patent is hereby corrected as shown below:

On the Title Page of the patent, Item (54) and at Column 1, lines 1 and 2:

please change the title "TRANSISTORS FABRICATED USING A REDUCED COST CMOS PROCESS" to read:

--"N-CHANNEL MOS TRANSISTOR FABRICATED USING A REDUCED COST CMOS PROCESS"--.

This certificate supersedes the Certificate of Correction issued February 9, 2010.

Signed and Sealed this

Ninth Day of March, 2010

David J. Kappos
*Director of the United States Patent and Trademark Office*